(12) United States Patent
Poole

(10) Patent No.: US 6,779,962 B2
(45) Date of Patent: Aug. 24, 2004

(54) DEVICE FOR HANDLING FLAT PANELS IN A VACUUM

(75) Inventor: Dennis P. Poole, New Palestine, IN (US)

(73) Assignee: Brooks Automation, Inc., Chelmsford, MA (US)

(*) Notice: Subject to any disclaimer, the term of this patent is extended or adjusted under 35 U.S.C. 154(b) by 55 days.

(21) Appl. No.: 10/104,846
(22) Filed: Mar. 22, 2002

(65) Prior Publication Data
US 2003/0180126 A1 Sep. 25, 2003

(51) Int. Cl.[7] .................................................. B25J 9/04
(52) U.S. Cl. ..................... 414/744.2; 414/217; 414/941
(58) Field of Search .............................. 414/217, 744.6, 414/939, 935, 941, 225.01, 217.1, 744.2

(56) References Cited

U.S. PATENT DOCUMENTS

| | | | |
|---|---|---|---|
| 4,787,813 A | * 11/1988 | Stevens et al. | 414/744.5 |
| 4,820,109 A | 4/1989 | Witt | 414/282 |
| 5,102,373 A | * 4/1992 | Martinson et al. | 474/101 |
| 5,135,349 A | * 8/1992 | Lorenz et al. | 414/744.6 |
| 5,354,380 A | 10/1994 | Zejda | 118/719 |
| 5,794,487 A | * 8/1998 | Solomon et al. | 74/490.03 |
| 5,829,307 A | * 11/1998 | Harima et al. | 74/490.02 |
| 6,177,129 B1 | 1/2001 | Wagner et al. | 427/8 |
| 6,318,951 B1 | 11/2001 | Schmidt et al. | 414/744.5 |
| 6,585,478 B1 | * 7/2003 | Wood et al. | 414/806 |

* cited by examiner

Primary Examiner—Eileen D. Lillis
Assistant Examiner—Charles A. Fox
(74) Attorney, Agent, or Firm—Perman & Green, LLP; Richard Pickreign

(57) ABSTRACT

A linear motion assembly is provided as part of a robot for processing substrates in a vacuum. An effector assembly is mounted for linear movement on linear bearings. The end effectors are driven by cables which in turn are driven by a drive which is positioned in an adjacent pressure vessel maintained at atmospheric pressure.

15 Claims, 8 Drawing Sheets

DEVICE FOR HANDLING FLAT PANELS IN A VACUUM

BACKGROUND OF THE INVENTION

1. Field of the Invention

The present invention relates to a robot for handling flat panels such as liquid crystal displays during processing of such panels in a vacuum. In particular the robot system of this invention operates in a vacuum using linear motion.

2. Brief Description of Related Developments

Many different types of robots exist for use in the processing of semiconductor and other components in an evacuated environment. These robots generally have multiple axes of movement which must occur within a confined area, i.e., within a vacuum chamber. It is desirable therefore, to construct the moving elements of the robot in a manner which limits the operational area (foot print) of the robot. This is generally accomplished by providing rotating and translating linkages which move the work piece holder (end effector) through a path in which the work piece is picked up, processed and returned for transport.

The processing of semiconductors often involves multiple process steps, such as, the deposit of a film on a substrate by chemical vapor deposition (CVD), the photo etching of the film, heating, cooling and cleaning.

The process operations are generally performed under vacuum in a specialized process chamber. Because of the need for improved efficiency of each process, batch processing of semiconductor substrates has generally been used for substrate processing. This is because, for each process step, the process chamber must be vented, the substrate loaded, the chamber sealed and pumped to vacuum. After processing, the steps are reversed.

To improve the process efficiency, a cluster of processing chambers are arranged around a substrate transport chamber which is constructed to be kept under vacuum. One or more load lock chambers are connected through slit valves to the transport chamber.

The load locks accommodate cassettes of substrates to be processed. The cassettes are delivered to the load lock by the front end delivery transport of the system. A load lock constructed to accommodate such cassettes is shown in U.S. Pat. No. 5,664,925 owned in common with the subject application. The disclosure of the '925 patent is incorporated herein by reference, in its entirety.

In this manner cycling times are reduced, while significantly increasing system throughput. The process and transport chambers are maintained continuously under vacuum, while only the load lock is cycled. The load lock receives the substrates to be processed after being sealed from the transport chamber and vented to atmosphere. The front end port is than sealed and the load lock is pumped to a vacuum consistent with the transport and processing chambers.

A robotic transfer mechanism is mounted within the transport chamber and operates to remove substrates from the load lock and deliver them to the selected process chambers. After processing, the substrates are picked up by the robot and transported to the next process chamber or to a load lock for removal from the transport chamber. In some instances, for timing purposes, these systems may employ buffer stations which are adapted to store substrates either before loading or at other times during the transport of the substrate through the system. The A system of this type is described in U.S. Pat. No. 5,882,413 and an example of a robotic transfer mechanism is shown in U.S. Pat. No. 5,647,724, each of which is assigned to a owner common to this application. The disclosures of these patents are incorporated herein by reference in their entirety.

As such systems are used for larger and larger semiconductor devices, such as liquid crystal displays and the like, the challenge of generating the required movement of the substrate through its processing path within as compact a space as possible becomes significant. As shown in the linkage systems of the above referenced patents, a series of rotating linkages, such as a SCARA, or two link robot arm linkage, are actuated through rotary drives to translate the end effector of the robot through the desired trajectory. In some instances it would be desirable to use linear movement to obtain the desired directory because of its small foot print. This may be even more desirable where large substrates are being processed. An example of a system using linear movement is shown in U.S. Pat. No. 4,715,921. In particular the embodiments of FIGS. 4 and 11(a) of the '921 patent illustrated linear movement style mechanisms. Linear mechanisms, however, are generally known to be dirty, in that considerable particle contamination may be generated by the linear bearings and cable and pulley drive mechanisms.

It is the purpose of this invention to construct a robot for use in processing generally larger substrates in a vacuum, where the end effector uses linear motion in its trajectory. It is a further object of this invention to provide a robot having an end effector that is mounted on linear bearings and is cable driven. It is a further object of this invention to construct a robot system having a cable driven end effector which is mounted on linear bearings in which system contamination from the linear bearings and cable drive is minimized.

SUMMARY OF THE INVENTION

The present invention is directed to a robot system for transporting substrates for processing within a vacuum chamber. It is illustrated in conjunction with a batch processing system with multiple processing stations interconnected by a central transport chamber. Substrates are delivered or picked up from an external loading station through one or more load locks which cycle from vacuum to atmosphere by operation of appropriate slide valves. The transport mechanism of this invention may also be designed to service a single processing chamber.

The system of this invention utilizes a robot body which extends into the transport chamber and houses a rotary drive mechanism and components, such as wires and conduits which are isolated from the vacuum. An axially extended shaft is driven by the drive mechanism and extends upward from the robot body. The shaft is driven both axially and in rotation to provide vertical and rotary positioning. The housing within the robot body is generally maintained at atmospheric pressure. In addition the robot body forms a pedestal to support a linear motion assembly for rotation on the shaft about a vertical axis of the robot body.

The linear motion assembly comprises a U-shaped component housing which forms a sealed enclosure for the linear motion drive system. The U-shaped component housing is mounted on the shaft of the robot body for rotary motion therewith. The linear motion assembly further includes upper and lower end effectors supported on elongated wrist sections. The wrist sections are mounted for linear motion on linear bearings which are oriented transverse to the axis of the robot body. Since the end effectors are mounted on the U-shaped housing, they can be conveniently stacked one over the other, which provides a significant reduction in the footprint of a dual effector system.

The U-shaped component houses the drive motors, control components, wires and conduits for the linear drive of the linear motion assembly. Two leg sections support the linear bearings in their transverse orientation, one above the other. The linear drive motors, housed in each leg section, are mechanically connected through a dynamic seal to a pulley and cable system which is connected to drive the end effectors on the linear bearings. To minimize contamination, a labyrinth seal is constructed at the bottom of the linear bearings. These seals operate to prevent particles from the cable and pulley drive system and the linear bearings from entering the vacuum chamber and contaminating the substrate.

Through appropriate control algorithms executable by microprocessors located in the bridge portion of the U-shaped housing, the end effectors can be reciprocally activated to load and unload substrates to or from a process chamber.

In this manner, a robot system is constructed which provides rotary motion of the linear motion assembly about the axis of the robot body, vertical motion of the linear motion assembly on the axis of the robot body, and linear motion of the end effectors on the linear bearings.

BRIEF DESCRIPTION OF THE DRAWINGS

The invention is described in more detail below with reference to the attached drawing in which.

DETAILED DESCRIPTION OF THE PREFERRED EMBODIMENT

Figure 1:
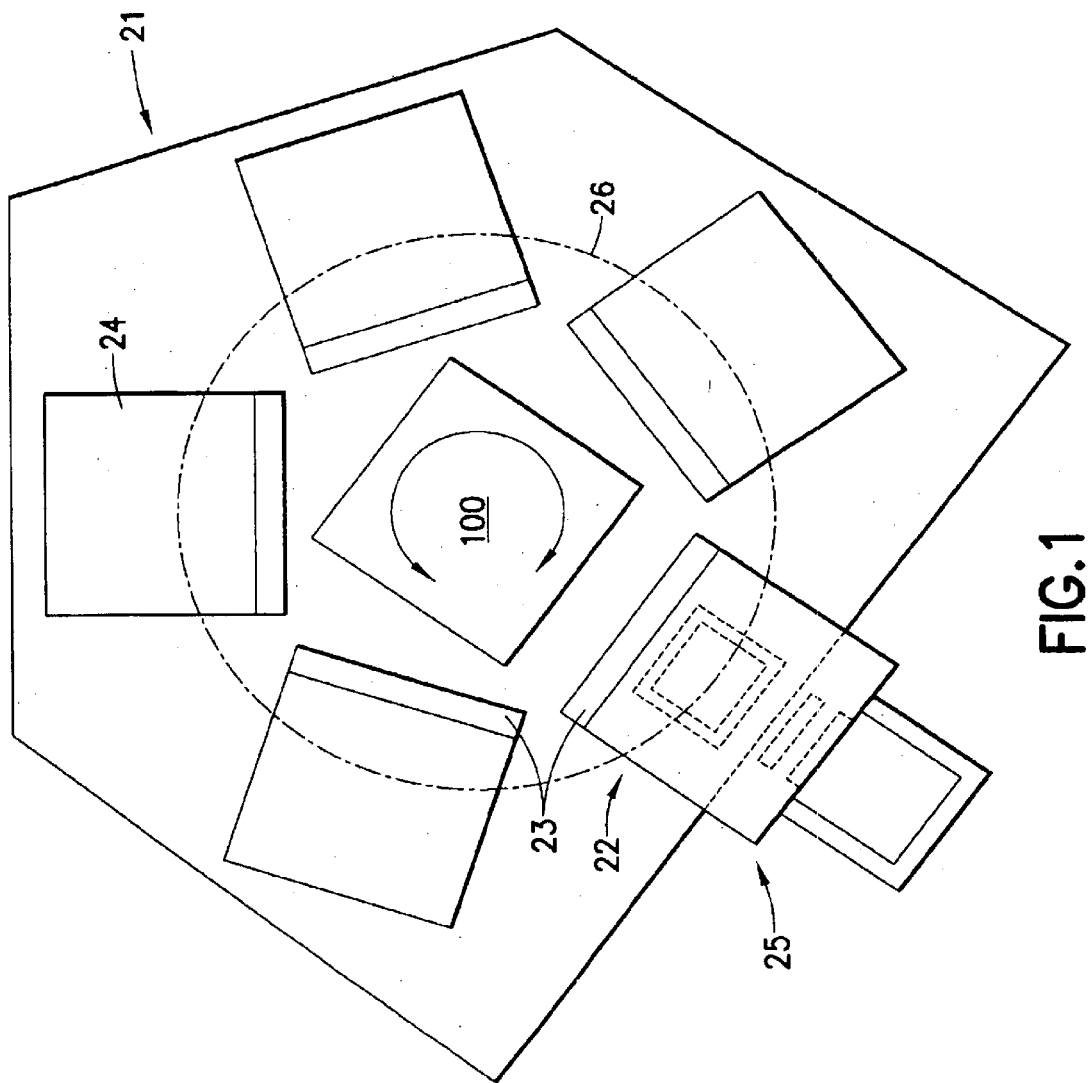
FIG. 1 is a schematic view of a batch processing system in which this invention may be used.
Figure 2:
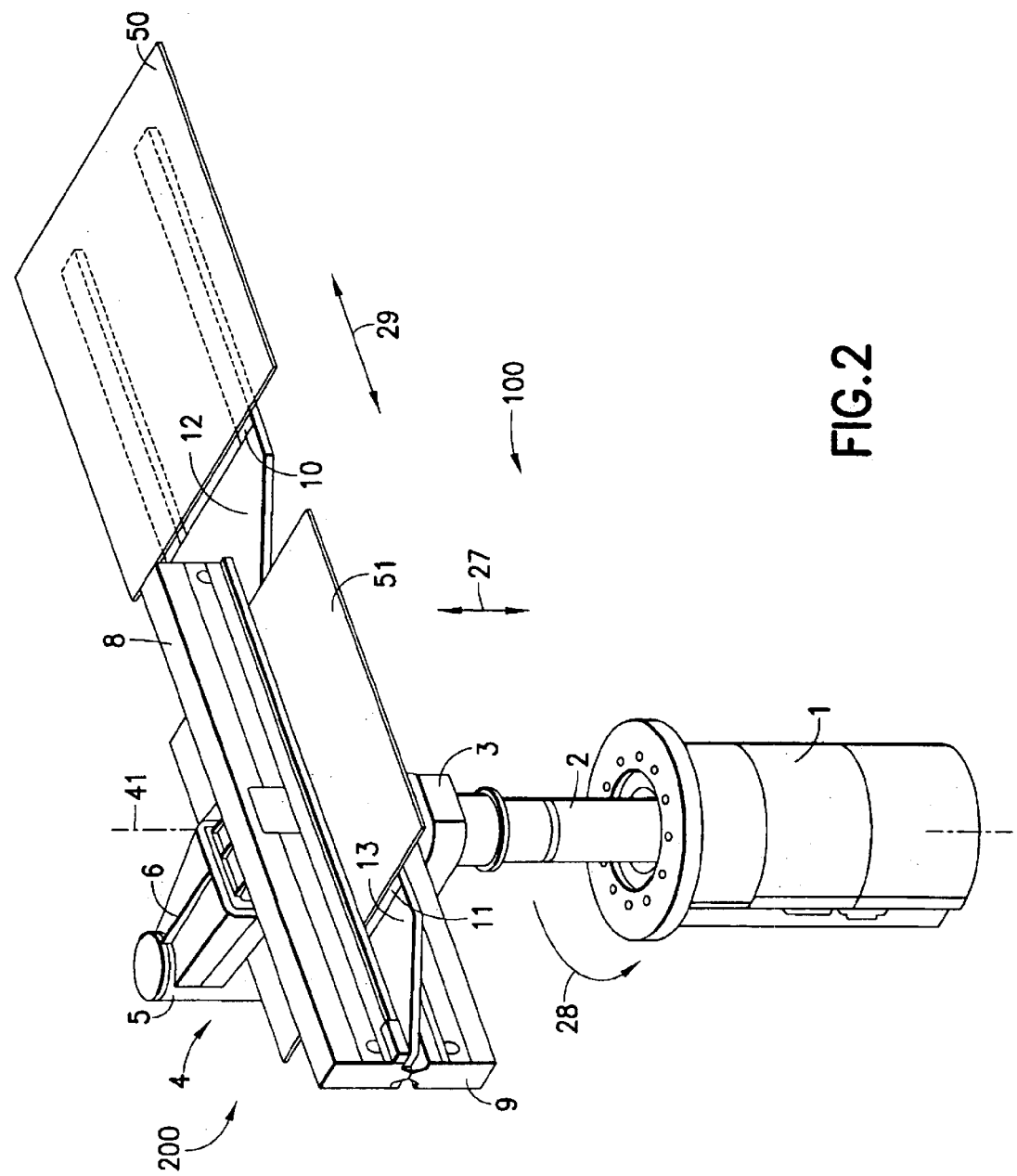
FIG. 2 is a schematic, perspective view of the robot system of this invention.
Figure 3:
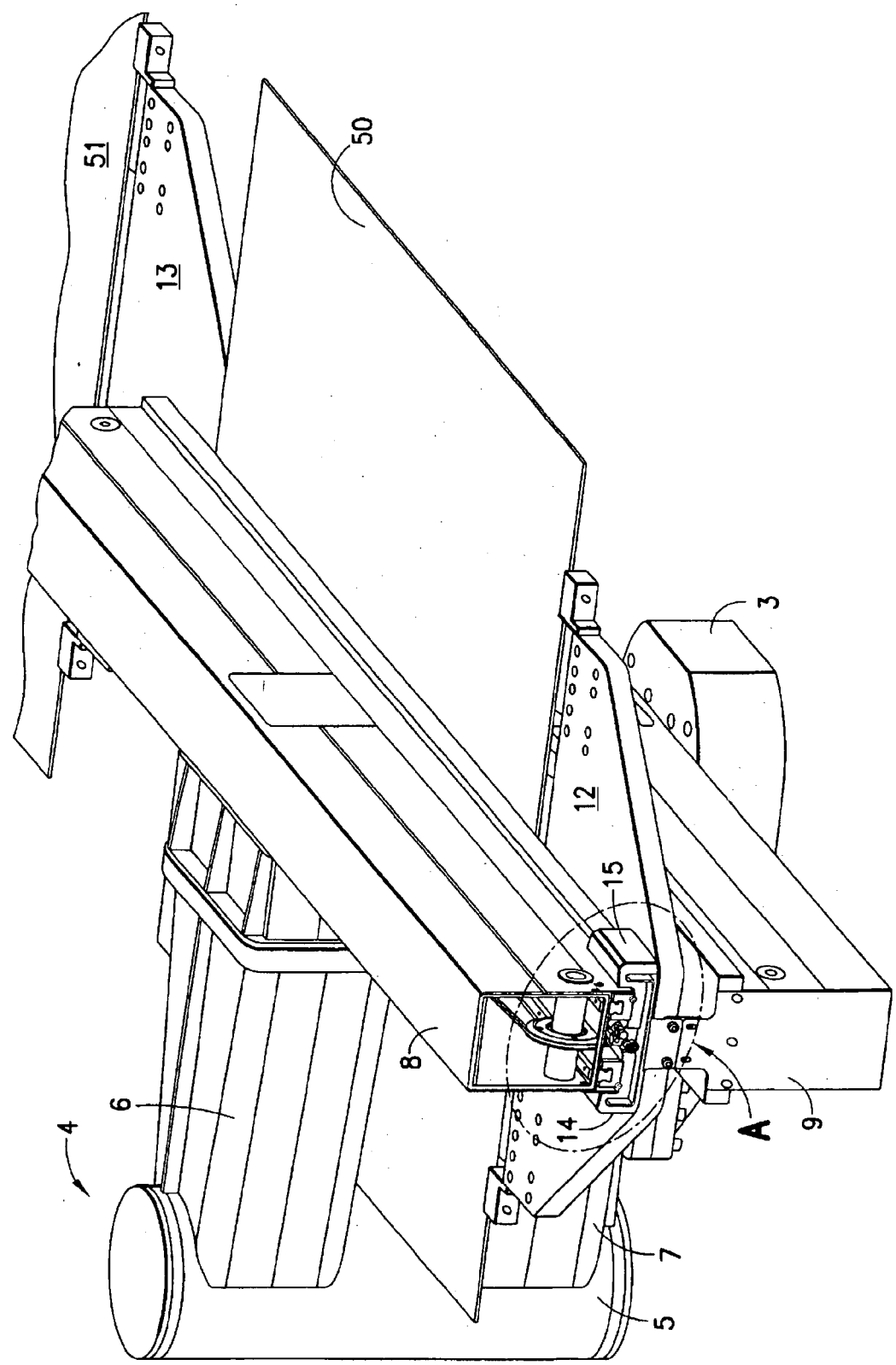
FIG. 3 is a schematic, perspective view of the robot system of FIG. 2 showing a linear motion assembly according to this invention.

Referring to FIG. 2, there is shown a perspective view of substrate transport system, robot system 100, incorporating features of the present invention. Although the present invention will be described with reference to the embodiment shown in the drawings, it should be understood that the present invention can be embodied in many alternate forms of embodiments. In addition, any suitable size, shape or type of elements or materials could be used.

A robot system 100 for transporting substrates for processing within a vacuum chamber is shown in FIG. 2. It is illustrated for use in conjunction with a batch processing system 21 System 21 is constructed with multiple processing stations 24 interconnected by a central transport chamber 26 by means of appropriate slide valves 23. Substrates (not shown) are delivered or picked up from an external loading station 29 through one or more load locks 22 which cycle from vacuum to atmosphere by operation of appropriate slide valves 23. The robot system 100, of this invention may also be designed to service a single processing chamber.

The system 100 of this invention utilizes a robot body 1 which extends into the transport chamber 26 and houses a rotary drive mechanism and components (not shown), such as, drive motors, control processors, wires, and conduits which are isolated from the vacuum maintained in transport chamber 26. An axially extended shaft 2 is driven by the drive mechanism within robot body 1. Shaft 2 extends upward from the robot body 1 and supports a mounting bracket 3. The shaft 2 is driven both axially, as shown by arrow 27, and in rotation, see arrow 28, to provide vertical and rotary positioning of the mounting bracket 3.

A linear motion assembly 200, is generally described herein, as including dual end effectors 10 and 11 for convenience of operation, it should be noted that in many applications a single end effector would suffice. The end effectors 10 and 11 are designed to hold substrates 50 and 51 during transport of the substrate for processing.

A linear motion assembly 200 is attached to mounting bracket 3 and comprises a U-shaped drive component housing 4. Housing 4 is constructed having an upper leg section 6 and a lower leg section 7 interconnected by a bridge section 5. The housing 4 forms a rigid support structure for the transport elements of the linear motion assembly 200 and is hollow to provide an interior enclosure 52 for the linear drive system. The interior enclosure 52 formed by the U-shaped housing 4 is constructed as a sealed pressure vessel isolated from the vacuum of transport chamber 26 by dynamic seals 35 and is maintained at atmosphere by connection to the robot body 1. Such isolation is needed to allow dependable operation of the drive motors and control components of the drive systems. Since the U-shaped component housing 4 is supported on the mounting bracket 3, the entire linear motion assembly 200 is mounted for both rotary and axial motion in accordance with arrows 27 and 28.

Figure 4:
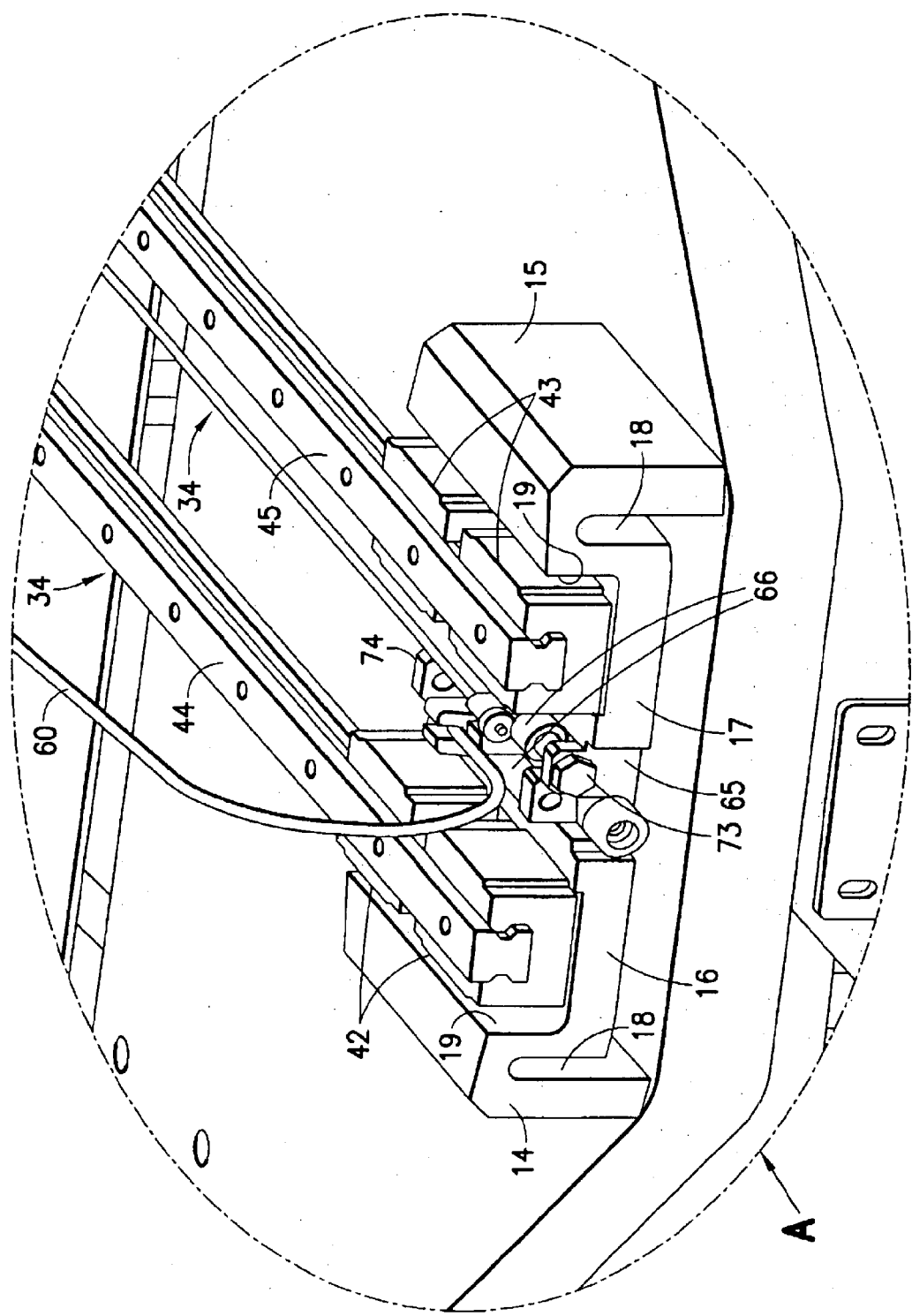
FIG. 4 is close up view of detail A of FIG. 3.
Figure 5:
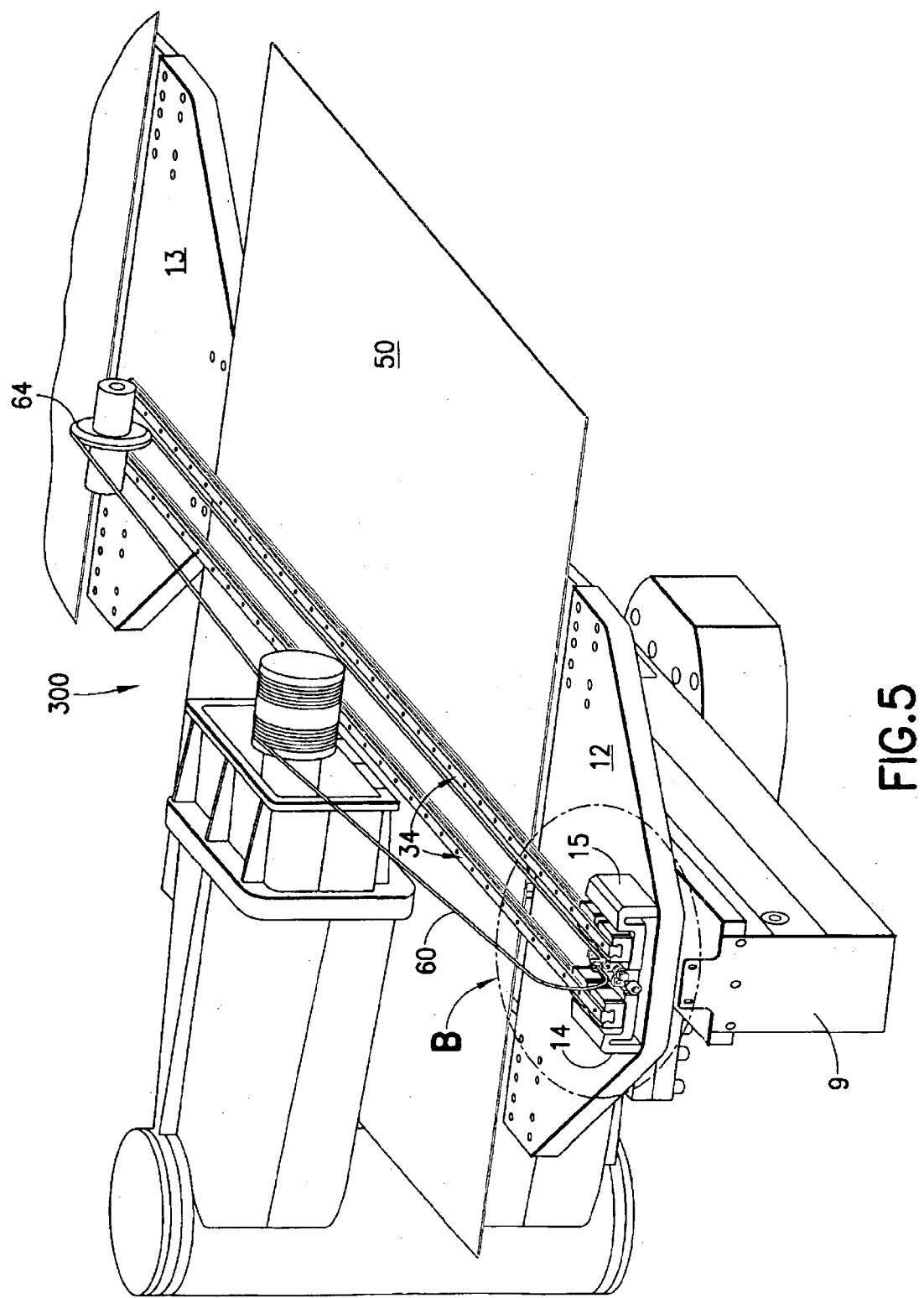
FIG. 5 is a schematic, perspective view of the cable drive system of this invention.

The linear motion assembly 200 further includes upper and lower end effectors 10 and 11 respectively. The end effectors are in turn supported on wrist sections 12 and 13 respectively, as best shown in FIG. 2. The wrist sections 12 and 13 are mounted for linear motion, as shown by arrow 29, on linear bearings 34 which are oriented transverse to the axis of the robot body. As shown in FIGS. 4 and 5, the wrist section 12 is connected to the linear bearing 34 by means of a pair of brackets 14 and 15. Linear bearings 34 consist of elongated bearing rails 44 and 45 mounted for sliding motion in bearing blocks 42 and 43. In this configuration, the end effectors are conveniently stacked one above the other, thereby obtaining a reduced footprint.

For simplicity only the mounting and associated components of the upper end effector 10 is described. It should be understood that the lower end effector has a structure and operation similar to that described for end effector 10.

Figure 6:
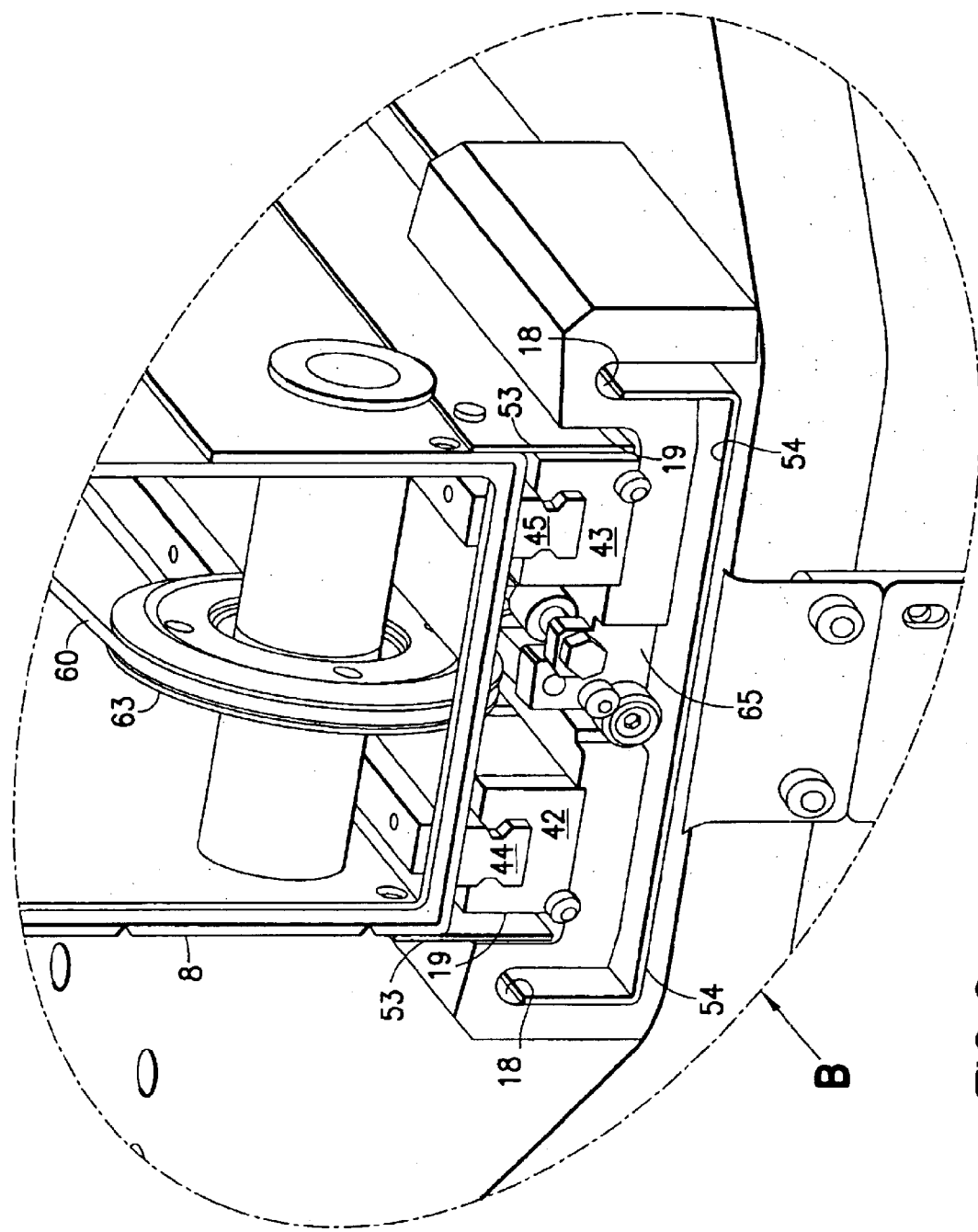
FIG. 6 is a close up view of detail B of FIG. 5.

Each of the brackets 14 and 15 are constructed with 1-shaped portions 16 and 17. The flat section formed by the legs of the 1-shaped sections 15 and 16 provide a surface for attachment to the bearing blocks 42 and 43, as best shown in FIG. 4. Brackets 14 and 15 are shaped to provide slots 18 and 19 which accommodate labyrinth seal elements 53 and 54, as shown in FIG. 6. This combination of slots 18, 19 and seal elements 53, 54 cooperate to form a tortuous path and trap for any particle contaminants that may be generated by the linear bearings 34 and the cable drive system 60.

In FIGS. 4–6, a drive system 300 for the linear motion assembly 200 is shown and includes forward and reverse cables 59 and 60 which are helically wound on a capstan 61.

Capstan 61 may be grooved to maintain the helical winding of the cable and is driven in rotation about an axial shaft 62. Cables 59, 60 extend from capstan 61 around pulleys 63 and 64 to attach to connector blocks 65 that are secured to brackets 14 and 15 of wrists 12 and 13 respectively. Both of the cables 59, 60 are attached to capstan 61 so that one cable is picked up as the other is pulled. Cables 59, 60 are pretensioned against a stack of Belleville washers 66 at their connection to block 65. Helical springs could also serve this purpose. Appropriate fittings are used to connect the cables 59, 60 to block 65 and may include tension adjustments such as adjustment screws 73 and 74.

Figure 7:
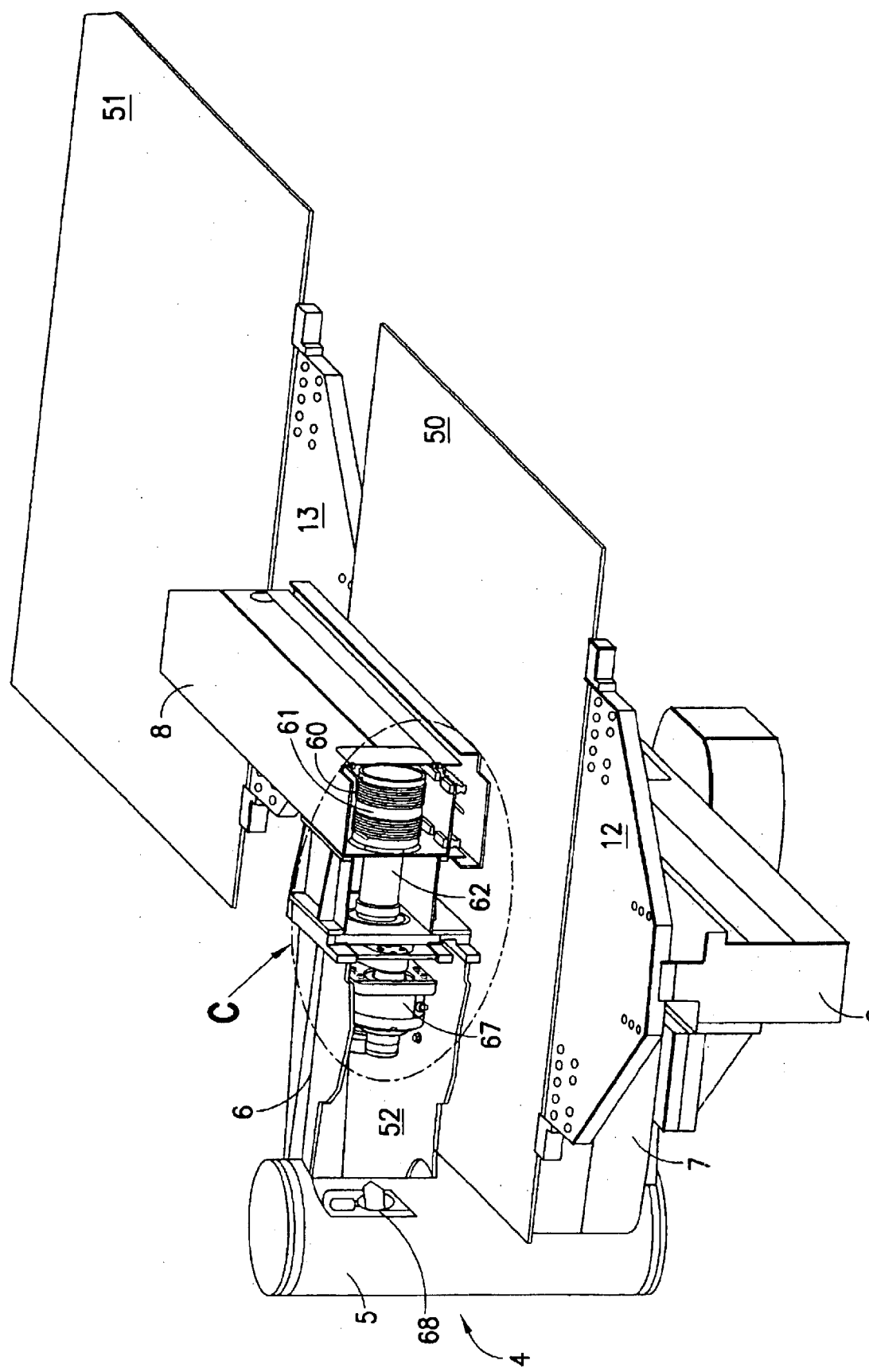
FIG. 7 is a cut away, schematic, perspective view of the linear bearing drive components.
Figure 8:
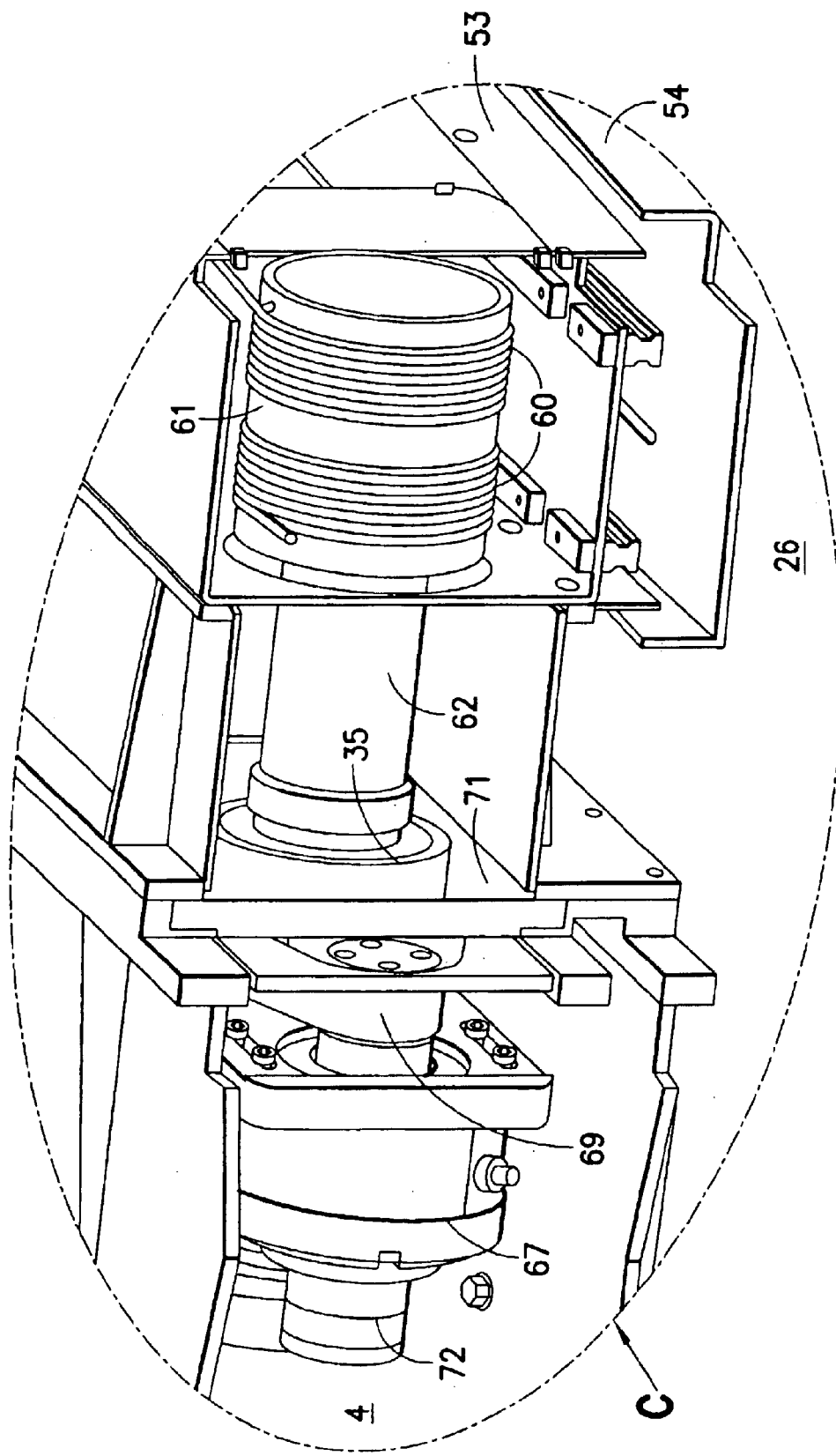
FIG. 8 is a close up of detail C of FIG. 7.

As shown in FIGS. 7 and 8, Capstan 61 is driven by a motor 67 and controller 68 contained in the U-shaped housing 4. Motor 67 drives shaft 62 through belt 69. Controller 68 activates rotary motion of motor 67 through encoder 72.

Since the capstan and cable assembly is within the vacuum of transport chamber 26 and the drive elements are in the pressure vessel of housing 4, a dynamic seal 35 is provided for the shaft 62 as it passes through the wall 71 of housing 4. Dynamic seal 35 isolates housing 4 from the transport chamber 26. This is necessary for the proper operation of the drive components.

In order to avoid contamination by residual manufacturing oil on the cables 59 and 60. The cable material is subjected to cleaning and electro-polishing to remove such residue. The residue oils tend to give off gaseous contaminants when used under vacuum. To lubricate the linear bearings and cable for operation in vacuum chamber 26, a non-outgassing lubricant is used.

The subject system is particularly effective in processing large panels, such as LCD displays which may be from 106 to 140 inches long. The system may be used advantageously for smaller substrates as well. The system provides a robot transport mechanism which uses linear motion within a vacuum, while avoiding contamination of the vacuum chamber. The linear motion provides a compact motion foot print for the robot.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A linear motion assembly for transporting substrates in a vacuum chamber, said linear motion assembly comprising:
    a linear bearing mounted within said vacuum chamber;
    at least one end effector for engaging and supporting a substrate for transport, mounted for linear movement on said linear bearing;
    a housing mounted on the linear motion assembly and enclosing a pressure chamber, said pressure chamber being isolated from said vacuum chamber; and
    a drive system mounted within said housing and operatively connected with said at least one end effector to cause movement of said end effector along the linear bearing, wherein said drive system is connected to said end effector through a dynamic seal, to maintain said pressure chamber in isolation from said vacuum chamber.

2. A linear motion assembly for transporting substrates in a vacuum chamber, said linear motion assembly, as described in claim 1, wherein said linear bearing further comprises:
    at least one bearing rail fixed on said linear motion assembly;
    at least one bearing block attached to said at least one end effector and mounted for linear motion on said bearing rail; and
    a labyrinth seal constructed to trap particle contaminants generated by said linear bearing.

3. A linear motion assembly for transporting substrates in a vacuum chamber, said linear motion assembly, as described in claim 1, wherein said pressure chamber is maintained substantially at atmospheric pressure.

4. A linear motion assembly for transporting substrates in vacuum chamber, said linear motion assembly, as described in claim 1, wherein said drive system further comprises:
    a capstan mounted on a shaft for rotation on said assembly;
    a cable helically wound on said capstan and connected at either end to said at least one end effector, so that when the capstan rotates, one end of the cable winds around said capstan and the other end unwinds, causing movement of said at least one end effector on said linear bearing; and
    wherein said drive system is operatively connected to said shaft to cause rotation of said capstan, wherein said shaft is surrounded by a dynamic seal as it extends through said housing to seal the pressure chamber of said housing from said vacuum chamber.

5. A linear motion assembly for transporting substrates in vacuum chamber, said linear motion assembly, as described in claim 4, wherein said cable is connected to said at least one end effector by means of a spring and further wherein said cable is pretensioned against said spring.

6. A linear motion assembly for transporting substrates in vacuum chamber, said linear motion assembly, as described in claim 1, wherein said drive system further comprises a controller and encoder mounted in said pressure chamber.

7. A robot assembly for transporting substrates in a vacuum chamber, said robot assembly comprising:
    a robot body having a central axis and being fixed in said vacuum chamber, said robot body enclosing a first pressure chamber that is isolated from said vacuum chamber;
    a first drive system for providing both rotary and translatory motion along and about said axis, said drive system mounted within said first pressure chamber; and
    a linear motion assembly mounted on said robot assembly within said vacuum chamber and being operatively connected to said first drive system for movement therewith, said linear motion assembly further comprising:
    a linear bearing mounted within said vacuum chamber;
    at least one end effector for engaging and supporting a substrate for transport, mounted for linear movement on said linear bearing;
    a housing mounted on the linear motion assembly and enclosing a second pressure chamber, said second pressure chamber being isolated from said vacuum chamber; and
    a second drive system mounted within said housing and operatively connected with said at least one end effector to cause movement of said end effector, wherein said second drive system is connected to said end effector through a dynamic seal, to maintain said second pressure chamber in isolation from said vacuum chamber.

8. A robot assembly for transporting substrates in a vacuum chamber, as described in claim 7, wherein said robot assembly further comprises:

at least one bearing rail fixed on said linear motion assembly;

at least one bearing block attached to said at least one end effector and mounted for linear motion on said bearing rail; and a labyrinth seal constructed to trap particle contaminants generated by said linear bearing.

9. A robot assembly for transporting substrates in a vacuum chamber, as described in claim 7, wherein at least said second pressure chamber is maintained substantially at atmospheric pressure.

10. A robot assembly for transporting substrates in vacuum chamber, as described in claim 7, wherein said second drive system further comprises:

a capstan mounted on a shaft for rotation on said assembly;

a cable helically wound on said capstan and connected at either end to said at least one end effector, so that when the capstan rotates, one end of the cable winds around said capstan and the other end unwinds, causing movement of said at least one end effector on said linear bearing; and wherein said second drive system is operatively connected to said shaft to cause rotation of said capstan, wherein said shaft is surrounded by a dynamic seal as it extends through said housing to seal the second pressure chamber of said housing from said vacuum chamber.

11. A robot assembly for transporting substrates in vacuum chamber, as described in claim 10, wherein said cable is connected to said at least one end effector by means of a spring and further wherein said cable is pretensioned against said spring.

12. A robot assembly for transporting substrates in vacuum chamber, as described in claim 7, wherein said second drive system further comprises a controller and encoder mounted in said second pressure chamber.

13. A linear motion assembly for transporting substrates in a vacuum chamber, said linear motion assembly comprising:

a U-shaped housing having a pair of leg sections and a bridge section, said housing mounted in said vacuum chamber, said housing enclosing a pressure chamber, said pressure chamber being isolated from said vacuum chamber;

a first linear bearing mounted on one of said leg sections and second linear bearing separately mounted on the other of said leg sections;

first and second end effectors for engaging and supporting a substrate for transport, separately mounted for linear movement on said linear bearings;

first and second drive systems separately mounted within said housing and operatively connected with said first and second end effectors respectively to cause movement of said end effectors, wherein said drive systems are connected to said respective end effectors through a dynamic seal, to maintain said pressure chamber in isolation from said vacuum chamber.

14. A linear motion assembly for transporting substrates in a vacuum chamber, as described in claim 13, wherein said assembly further comprises:

a robot body having a central axis and fixed in said vacuum chamber, said robot body enclosing a second pressure chamber that is isolated from said vacuum chamber;

a third drive system for providing both rotary and translatory motion along and about said axis, said third drive system mounted within said second pressure chamber; and wherein said linear motion assembly is mounted on said robot body in operative connection to said second drive system for movement therewith.

15. A linear motion assembly for transporting substrates in a vacuum chamber, as described in claim 13, wherein said U-shaped housing is oriented so that one leg is above the other so that one of said end effectors has a plane of motion above the other of said end effectors.

* * * * *